US009596784B2

(12) United States Patent
Duncan et al.

(10) Patent No.: US 9,596,784 B2
(45) Date of Patent: Mar. 14, 2017

(54) MULTI-CHAMBER COOLING SYSTEM

(71) Applicant: True Power Electric, LLC, West Valley, UT (US)

(72) Inventors: Scott C. Duncan, West Jordan, UT (US); Collin S. Duncan, West Jordan, UT (US); Jacob B. Duncan, West Jordan, UT (US)

(73) Assignee: TRUE POWER ELECTRIC, LLC, West Valley, UT (US)

( * ) Notice: Subject to any disclaimer, the term of this patent is extended or adjusted under 35 U.S.C. 154(b) by 0 days.

(21) Appl. No.: 14/656,819

(22) Filed: Mar. 13, 2015

(65) Prior Publication Data

US 2016/0270255 A1  Sep. 15, 2016

(51) Int. Cl.
*H05K 7/20* (2006.01)
*G06F 1/20* (2006.01)

(52) U.S. Cl.
CPC ..... *H05K 7/20209* (2013.01); *H05K 7/20136* (2013.01); *G06F 1/20* (2013.01)

(58) Field of Classification Search
CPC ...... H05K 7/20; H05K 7/207; H05K 7/20736; H05K 7/14; H05K 5/00; H05K 5/02; H05K 1/14; H05K 3/30; G06F 1/16; G06F 1/18; G06F 1/181; G06F 1/20; H02B 1/565
USPC ............... 361/679.46–679.5, 690–696, 715, 361/722–728; 165/80.2, 80.3, 121–126; 454/184; 312/223.2
See application file for complete search history.

(56) References Cited

U.S. PATENT DOCUMENTS

| | | | | |
|---|---|---|---|---|
| 4,817,865 A | * | 4/1989 | Wray | H05K 7/207 165/247 |
| 5,121,291 A | * | 6/1992 | Cope | G06F 1/206 165/58 |
| 5,493,457 A | * | 2/1996 | Kawamura | G11B 33/142 360/97.12 |
| 5,813,243 A | * | 9/1998 | Johnson | G06F 1/20 361/678 |
| 6,597,569 B1 | * | 7/2003 | Unrein | G06F 1/181 361/679.4 |
| 6,704,196 B1 | * | 3/2004 | Rodriguez | H05K 7/20736 165/104.33 |
| 7,333,330 B2 | * | 2/2008 | McEwan | G06F 1/20 361/679.48 |
| 7,813,127 B2 | * | 10/2010 | Nishikawa | H04N 5/64 174/16.1 |

(Continued)

*Primary Examiner* — Adam B Dravininkas
(74) *Attorney, Agent, or Firm* — Keller Jolley Preece

(57) ABSTRACT

The principles described herein provide an electrical system having multiple chambers that contain different types of electrical components. In particular, the electrical system can include a first chamber that contains a first type of electrical components. The electrical system can further include a second chamber that contains a second type of electrical components. Additionally, the first and second types of electrical components can have different operating temperatures. The electrical system can include a cooling system to maintain the first and second chambers at different temperatures based on the operating temperatures of the respective electrical components. Maintaining the chambers at different temperatures can conserve energy and facilitate optimal performance of the different electrical components within the electrical system.

19 Claims, 9 Drawing Sheets

(56) References Cited

U.S. PATENT DOCUMENTS

| | | | | |
|---|---|---|---|---|
| 7,953,574 B2 * | 5/2011 | Arakawa | ............... | G06F 1/206 374/137 |
| 8,218,317 B2 * | 7/2012 | Tsakanikas | ............... | G06F 1/18 361/679.46 |
| 8,553,411 B2 * | 10/2013 | Abraham | ............... | G06F 1/20 361/679.47 |
| 8,929,066 B2 * | 1/2015 | Herman | ............... | G06F 1/20 165/80.3 |
| 9,310,860 B2 * | 4/2016 | Anuez | ............... | G06F 1/181 |
| 2008/0043405 A1 * | 2/2008 | Lee | ............... | G06F 1/185 361/600 |
| 2014/0260397 A1 * | 9/2014 | Agnaou | ............... | H02B 1/565 62/259.2 |

* cited by examiner

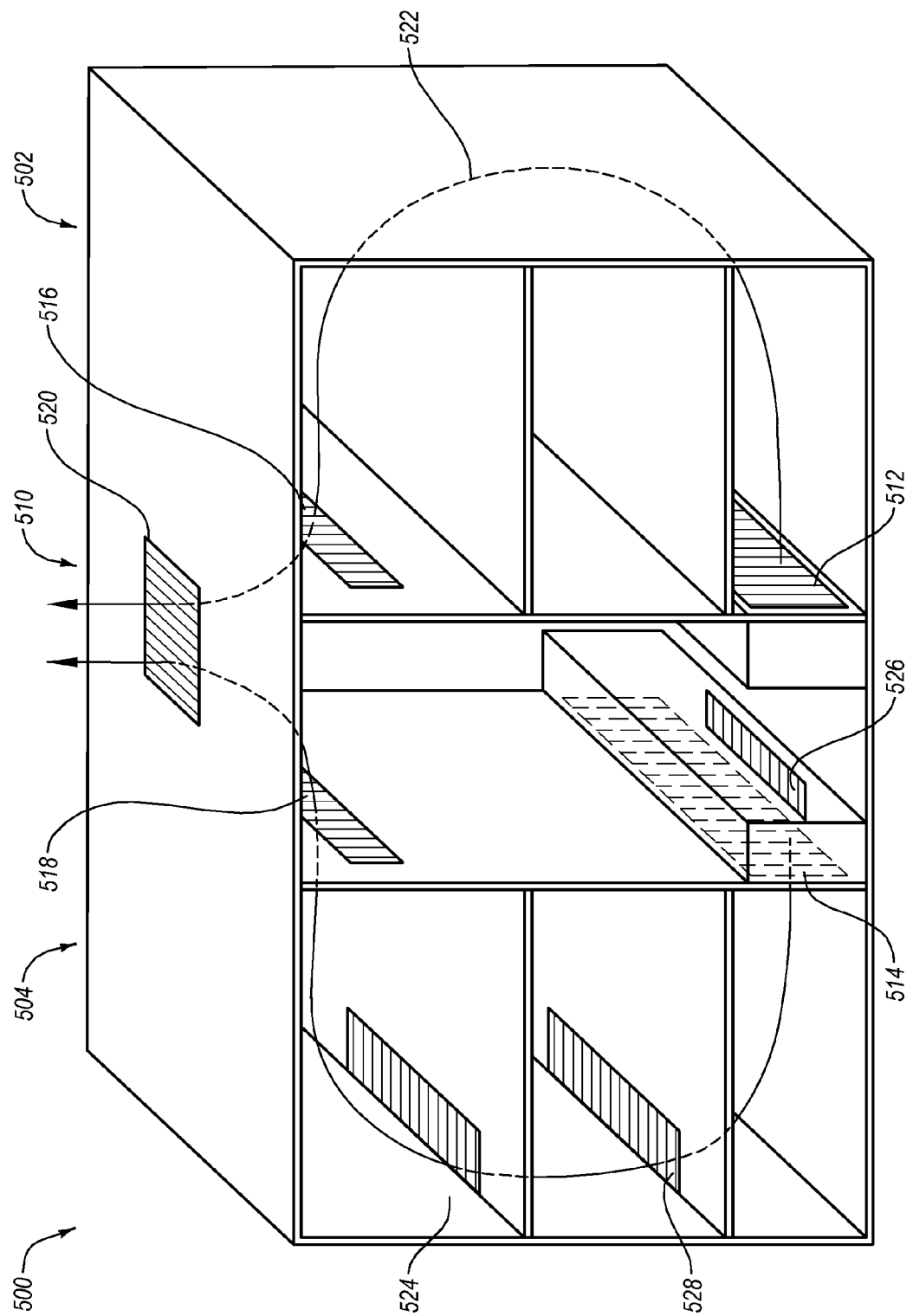

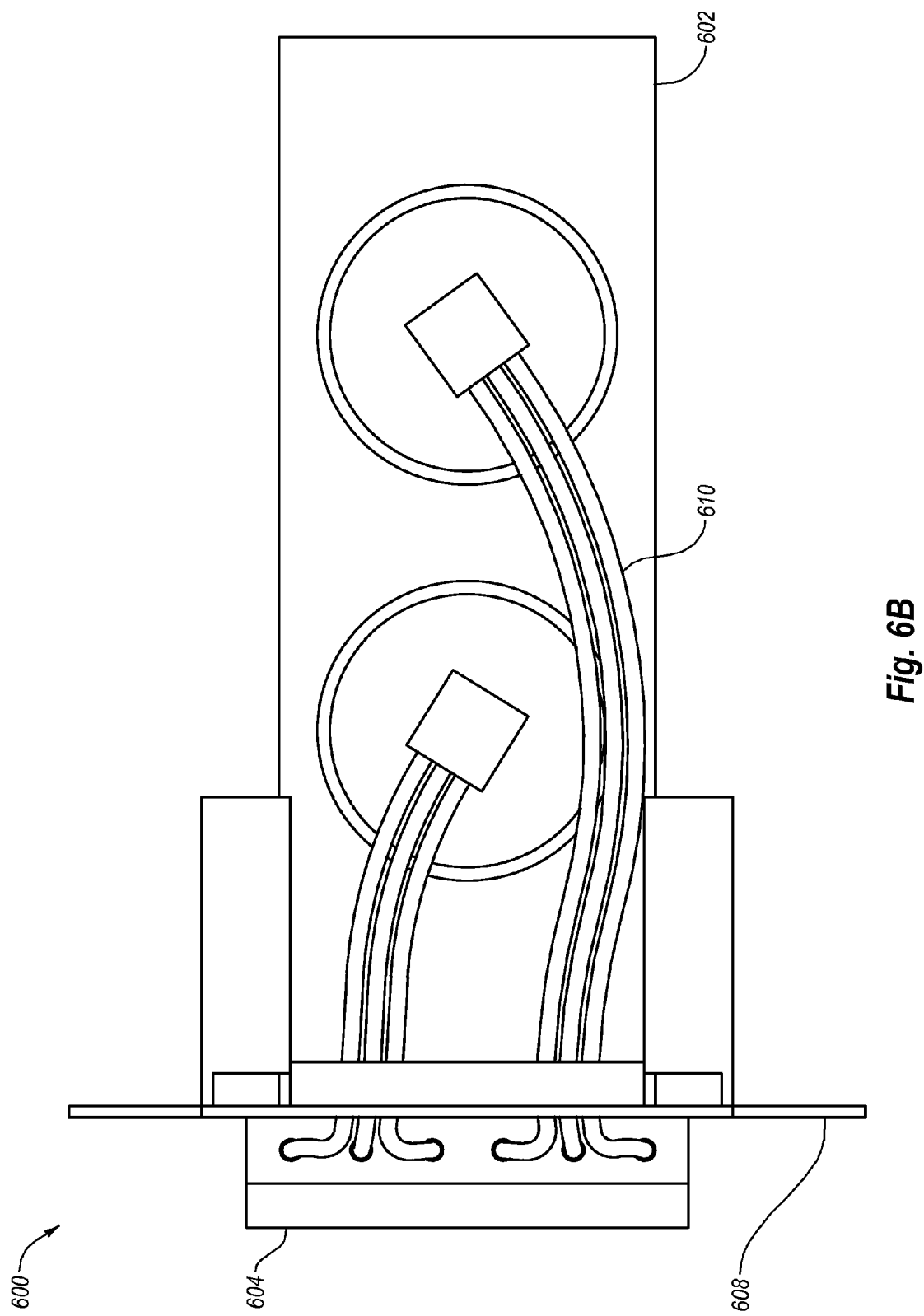

MULTI-CHAMBER COOLING SYSTEM

BACKGROUND

1. Technical Field

One or more embodiments of the present disclosure generally relate to systems and devices for cooling an electrical system. More specifically, one or more embodiments of the present disclosure relate to cooling different types of electrical components within an electrical system.

2. Background and Relevant Art

Conventional electrical systems often include multiple electrical components operating in a compact space. During operation, electrical components within the electrical system may often generate unwanted amounts of heat. Unregulated, the generated heat can diminish performance of the electrical system and/or cause permanent damage due to overheating of components within the electrical system. To regulate temperature, an electrical system often includes a cooling system to improve operation and prevent components within the electrical system from overheating. Thus, cooling systems can protect components of electrical systems, as well as improve operation of the electrical system.

Conventional electrical systems, however, suffer from a number of limitations and drawbacks. For example, different components generating different amounts of heat often complicate efforts to cool an electrical system having different types of electrical components. For example, different electrical components often generate different amounts of heat, thus requiring that an electrical system provide cooling for every component within the electrical system based on whichever component(s) generate the most amount of heat.

Additionally, due to the complexity and compact nature of many electrical systems, a technician may have difficulty performing maintenance on an electrical system. For example, typical electrical systems often include crowded arrangements of different types of electrical components that require an in depth understanding of the electrical system in order to perform effective maintenance on the electrical system. The additional time and expertise required to perform maintenance and/or replace components within the electrical system may lead to longer periods of inoperability or down times in the event of component failure or overheating, and increases operating costs of the electrical system in general.

Additionally, electrical systems that require cooling are often bulky and immobile. For example, servers or other electrical systems often require a cooling system generated from the infrastructure of a building, room, or other surrounding environment. These electrical systems and cooling systems are generally expensive, immobile, and are often difficult to update or modify.

Accordingly, there are a number of considerations to be made in cooling electrical systems.

BRIEF SUMMARY

The principles described herein provide benefits and/or solve one or more of the foregoing or other problems in the art. For example, an electrical system (or simply "system") can include multiple chambers for cooling different types of components within a system. In particular, the system can include multiple chambers maintained at different temperatures to cool different types of electrical components having different operating temperatures. Cooling different types of electrical components at different temperatures can conserve energy when cooling a system having different types of electrical components. In this way, the system can conserve energy while effectively preventing various components within the system from overheating.

Additionally, the system can provide cooling for different types of electrical components in accordance with different operating temperatures of the electrical components. In particular, different types of electrical components can function differently at different temperatures. Cooling the different types of electrical components based on respective operating temperatures can facilitate more efficient cooling of the electrical components in addition to improving the functionality of the different electrical components within the system. Thus, in addition to conserving energy, cooling different types of electrical components at different temperatures can improve the overall functionality of the system.

In one or more additional embodiments, the system can include one or more features to facilitate easy maintenance and servicing of the system and/or a cooling system. For example, grouping electrical components in different cooling chambers can facilitate easy access to specific components without requiring that a technician have an in depth understanding of the system. Additionally, grouping electrical components in different chambers can enable efficient troubleshooting of a system that is not operating as expected. In some embodiments, different electrical components can be selectively removed and/or installed without interrupting operation of the system, thus decreasing any periods of inoperability or down time in the event of component failure or overheating.

Furthermore, in accordance with one or more embodiments, the system can include one or more features to facilitate greater mobility of the system and/or cooling system. For example, the system can include one or more chambers that contain or house different electrical components. Additionally, the system can include multiple chambers within a single device capable of connecting and/or disconnecting the electrical components of the system to an external system. Improving mobility of the system and components contained within the system can facilitate easier updating or modifying of electrical components within and/or attached to the system.

Additional features and advantages of exemplary embodiments will be set forth in the description which follows, and in part will be obvious from the description, or may be learned by the practice of such exemplary embodiments. The features and advantages of such embodiments may be realized and obtained by means of the instruments and combinations particularly pointed out in the appended claims. These and other features will become more fully apparent from the following description and appended claims, or may be learned by the practice of such exemplary embodiments as set forth hereinafter.

BRIEF DESCRIPTION OF THE DRAWINGS

In order to describe the manner in which the above-recited and other advantages and features of the embodiments can be obtained, a more particular description of the principles briefly described above will be rendered by reference to specific embodiments thereof that are illustrated in the appended drawings. It should be noted that the figures are not drawn to scale, and that elements of similar structure or function are generally represented by like reference numerals for illustrative purposes throughout the figures. Understanding that these drawings depict only typical embodiments and are not therefore to be considered to be limiting of its scope, principles will be described and explained with additional specificity and detail through the use of the accompanying drawings.

FIG. 5 illustrates a perspective view of an electrical system in accordance with one or more embodiments described herein.

FIG. 6B illustrates a top view of a removable casing in accordance with one or more embodiments described herein.

DETAILED DESCRIPTION

Figure 1:
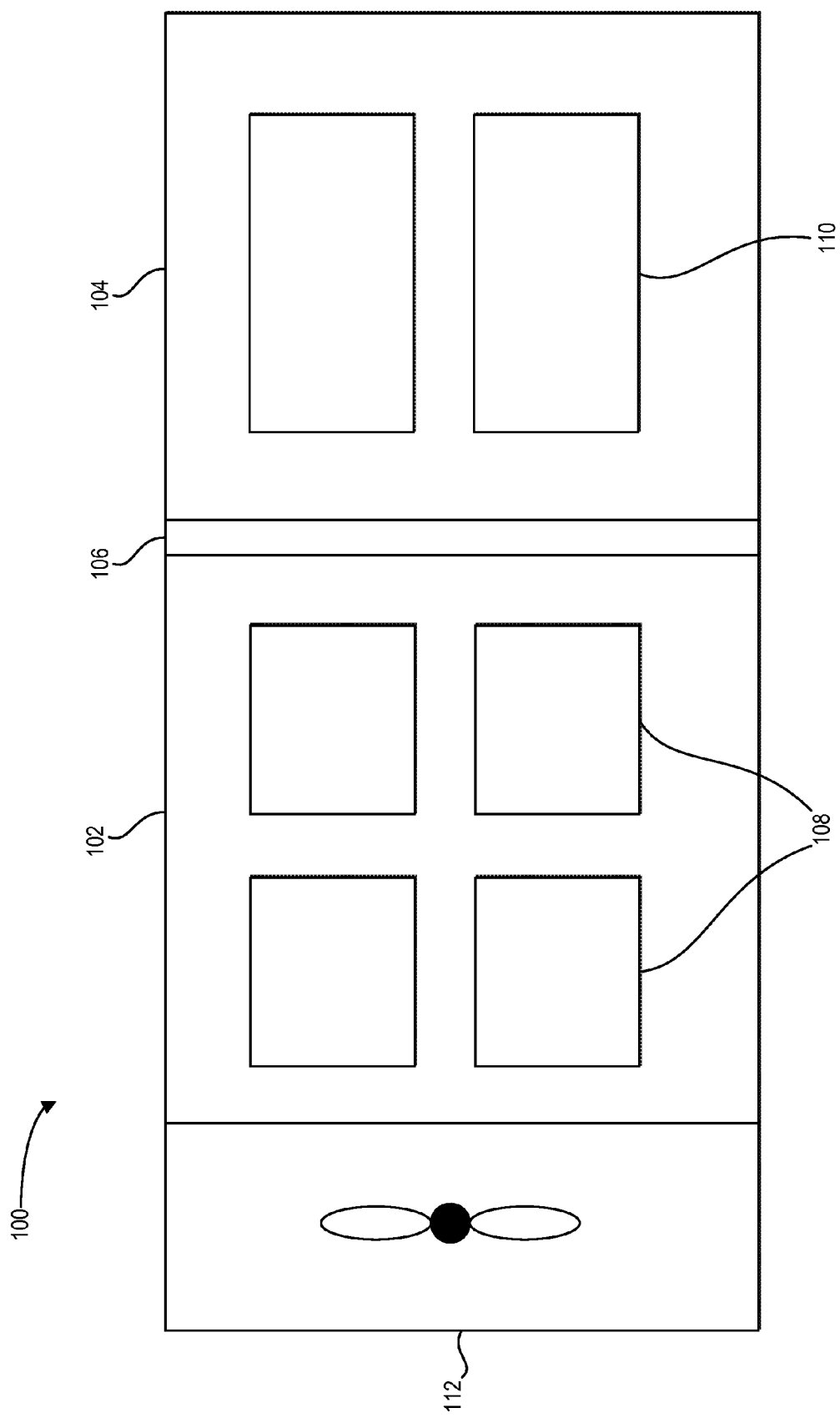
FIG. 1 illustrates a block diagram of an electrical system in accordance with one or more embodiments described herein.

One or more embodiments described herein include an electrical system (or simply "system") having multiple chambers that contain different types of electrical components. In particular, a system can include a first chamber that contains a first type of electrical components. The system can further include a second chamber that contains a second type of electrical components. In some embodiments, the first type of electrical components and second type of electrical components have different operating temperatures. In particular, the first type of electrical components can perform more effectively at a different temperature than the second type of electrical components.

Using principles described generally above, one or more embodiments of the system can allow for more efficient cooling of components within the system. In particular, the system can include a cooling system that maintains and/or cools a first chamber and a second chamber of the system at different temperatures. More specifically, the system can cool the different chambers at different temperatures depending the different type of electrical component contained within the chambers. For example, where a first type of electrical component is a capacitor, the cooling system can cool the first chamber containing the capacitors at an optimal temperature for more effective functionality of the capacitors. Additionally, where a second type of electrical component is a transformer, the cooling system can cool the second chamber containing the transformers at an optimal temperature for effective functionality of the transformers. By cooling the different chambers based on optimal operating temperatures of the capacitors and transformers, the cooling system can facilitate more efficient and effective operation of the system.

In addition to cooling the different chambers at different temperatures, the system can further include one or more features to facilitate easy maintenance and servicing of the system. In particular, the system can include multiple chambers that contain the different types of electrical components in such a way that the electrical components can be accessed and/or serviced without requiring an in-depth understanding of how the electrical components are connected and/or how the electrical components interface with an external system. For example, where a first chamber contains capacitors and the second chamber contains transformers, a technician can access and/or service the capacitors without having any knowledge of how transformers work and/or how the capacitors are coupled to the transformers.

In addition to grouping the electrical components by type, the system can include one or more additional features to facilitate easy maintenance and servicing of the system. For example, the system can include one or more features to facilitate easy removal and replacement of electrical components. In some embodiments, for example, the system can include removable casings to secure electrical components within a chamber. Thus, a technician can service and/or replace different electrical components by removing and/or accessing the removable casings.

In some embodiments, the system can provide the above and additional benefits while containing and cooling the different types of electrical components within a compact and mobile device. In particular, the system can include any number of chambers with each chamber containing different types of electrical components within a single device. For example, in some embodiments, the system can include multiple chambers within a single device containing different types of electrical components that connect, disconnect, and/or interface with other electrical components within the system and/or components of an external system. Additionally, the system can connect and/or disconnect from an external system (e.g., a power delivery system) without interrupting operation of the external system.

As used herein, an "electrical component" may include any component used within an electrical circuit. Additionally, electrical components can refer to any part of an electrical circuit that generates heat or has an optimal operating temperature. Electrical components can include passive components and/or active components. Examples of electrical components can include, but are not limited to, resistors, capacitors, inductors, transformers, transistors, diodes, power sources, current sources, or a combination of different electrical components. Additionally, an electrical component can refer to any variation of a specific type of electrical component.

As used herein, an "operating temperature" may refer to a temperature at which an electrical component operates. In particular, an operating temperature of an electrical component may refer to a temperature at which the electrical component operates according to the specifications of the electrical component. In some embodiments, the operating temperature may refer to a desired range of temperatures at which an electrical component operates most effectively, or, alternatively, any temperature at which an electrical component may operate without causing damage to the electrical component or other components within a system. In some embodiments, for example, where an electrical component operates differently across a range of temperatures, an operating temperature may refer to a specific temperature or range of temperatures within the larger range of temperatures.

Exemplary systems and devices will now be described in reference to the drawings. For example, FIG. 1 illustrates an example of an electrical system 100 (or simply "system") in accordance with one or more principles described herein. In particular, FIG. 1 illustrates an example of a system 100 including a capacitor chamber 102, a transformer chamber 104, and a wall 106 providing a seal between the capacitor chamber 102 and the transformer chamber 104. Additionally, FIG. 1 illustrates one or more capacitors 108 contained within the capacitor chamber 102 and one or more transformers 110 contained within the transformer chamber 104. In some embodiments, the system 100 can further include a cooling system 112 for cooling the capacitor chamber 102 and/or the transformer chamber 104.

As illustrated in FIG. 1, the system 100 can include one or more chambers for containing different types of electrical components. For example, the system 100 can include a first chamber for housing a first type of electrical component and a second chamber for housing a second type of electrical component. In some embodiments, each chamber contains a single type of electrical component or electrical component having similar operating temperatures. Alternatively, each chamber can contain various types of electrical components.

As illustrated in FIG. 1, the system 100 can include a capacitor chamber 102 containing one or more capacitors 108 and a transformer chamber 104 containing one or more transformers 110. While FIG. 1 specifically illustrates a capacitor chamber 102 and a transformer chamber 104, it is appreciated that the system 100 can include any number of chambers configured to contain different types of electrical components. Thus, in referring to specific examples of electrical components (e.g., capacitors 108, transformers 110), description directed to specific types of electrical components can also apply more generally to various types of electrical components.

As mentioned above, the system 100 can include a capacitor chamber 102 containing one or more capacitors 108. In particular, the capacitor chamber 102 can contain any number of capacitors 108. In some embodiments, the capacitor chamber 102 can contain multiple capacitors 108 of a single type. Alternatively, the capacitors 108 can include one or more different variations of capacitors 108. For example, the capacitors 108 can include different capacitors 108 having different capacitances and/or different volt ampere reactance (kvar) values. Additionally, the capacitors 108 can include different types of capacitors having similar operating temperatures.

Additionally, the capacitors 108 contained within the capacitor chamber 102 can have similar operating temperatures. For example, the capacitors 108 can have a design or configuration to operate optimally at or within a range of a particular temperature. In some embodiments, the capacitor chamber 102 can contain any number of capacitors 108 of the same or different variation or type that operate within the same range of a particular temperature. Thus, in addition to containing the capacitors 108, the capacitor chamber 102 can also contain other types of electrical components configured to operate at a similar temperature as the capacitors 108. Alternatively, the capacitor chamber 102 can contain only a single type or variation of capacitor 108.

Additionally, as illustrated in FIG. 1, the system 100 can include a transformer chamber 104 containing one or more transformers 110. In particular, the transformer chamber 104 can contain any number of transformers 110. In some embodiments, the transformer chamber 104 can contain multiple transformers 110 of a single type. For example, the transformers 110 may include one or more zig-zag transformers. Alternatively, the transformers 110 can include one or more different types of transformers 110.

Similar to the capacitors 108, the transformers 110 contained within the transformer chamber 104 can have similar operating temperatures. In particular, the transformers 110 can have a design or configuration to operate optimally at or within a range of a particular temperature. In some embodiments, the transformer chamber 104 can contain any number of transformers 110 of the same or different type that operate within a particular temperature range. Thus, in addition to containing the transformers 110, the transformer chamber 104 can also contain other types of electrical components configured to operate at a similar temperature as the transformers 110. Alternatively, the transformer chamber 104 can contain only a single type of transformer 110 (e.g., zig-zag transformers).

As mentioned above, the system 100 can include a wall 106 for separating the capacitor chamber 102 from the transformer chamber 104. In particular, the wall 106 can provide a thermal seal between the capacitor chamber 102 and the transformer chamber 104. For example, where the capacitor chamber 102 and the transformer chamber 104 are maintained at different temperatures, the wall 106 can prevent the temperature of the capacitor chamber 102 from affecting the temperature of the transformer chamber 104 and visa versa. In some embodiments, the wall 106 prevents any air flow from passing between chambers. Alternatively, the system 100 can include one or more features to facilitate a controlled air flow between the chambers.

The system 100 can further include a cooling system 112 for cooling the capacitor chamber 102 and the transformer chamber 104. In particular, the cooling system 112 can include one or more devices that cool or otherwise maintain the temperature of the capacitor chamber 102 and the transformer chamber 104. For example, the cooling system 112 can include one or more fans. Alternatively, the cooling system 112 can include one or a combination of other cooling mechanisms, such as liquid cooling, heat sinks, ventilation systems, and/or other systems and devices for cooling electrical components within the system 100.

As illustrated in FIG. 1, in some embodiments, the cooling system 112 can include one or more fans for directing air into the different chambers. In particular, the cooling system 112 can providing cooling air to the capacitor chamber 102 and/or the transformer chamber 104 to cool the capacitors 108 and the transformers 110. In some embodiments, the cooling system 112 can include a single device for cooling the various electrical components within the system 100. Alternatively, the cooling system 112 can include multiple devices for cooling the various electrical components within the system 100.

As illustrated in FIG. 1, the cooling system 112 can have a position next to the capacitor chamber 102. In particular, the cooling system 112 can initially cool the capacitor chamber 102 prior to cooling and/or maintaining a temperature of the transformer chamber 104. In some embodiments, the capacitor chamber 102 may benefit from maintaining a lower temperature than the transformer chamber 104 thus optimally having a position closer to the cooling system 112. In some embodiments, the capacitor chamber 102 can contain the cooling system 112 within the capacitor chamber 102. Alternatively, the cooling system 112 can have a position outside the capacitor chamber 102 and provide and/or direct cooling air into the capacitor chamber 102.

In some embodiments, the cooling system 112 can include one or more mechanisms or devices for cooling and/or maintaining a temperature of the capacitor chamber 102 and the transformer chamber 104. For example, as illustrated in FIG. 1, the system 100 can include one or more fans positioned near the capacitor chamber 102 to direct cooling air into the capacitor chamber 102 for cooling the capacitors 108. In some embodiments, the cooling system 112 can include any number of fans or other cooling devices positioned throughout the system 100 for cooling the capacitors 108, transformers 110 and/or any other electrical components within the system 100. Alternatively, the cooling system 112 can include a single cooling device positioned near or within the capacitor chamber 102.

In addition to cooling the capacitor chamber 102 and transformer chamber 104 generally, the cooling system 112 can cool one or both of the different chambers individually. In particular, the cooling system 112 can cool and/or maintain the capacitor chamber 102 at a first temperature based on an operating temperature, heat load, and/or ideal temperature for the operation of the capacitors 108. Additionally, the cooling system 112 can cool and/or maintain a temperature of the transformer chamber 104 at a second temperature based on an operating temperature, heat load, and/or ideal temperature for the operation of the transformers 110. In some embodiments, the cooling system 112 can cool the capacitor chamber 102 and the transformer chamber 104 by directing air into each chamber separately. Alternatively, the cooling system 112 can direct air into the capacitor chamber 102, which, upon cooling the capacitors 108, passes into the transformer chamber 104 to cool and/or maintain a temperature of the transformers 110. In some embodiments, the cooling system 112 cools the capacitor chamber 102 without cooling the transformer chamber 104.

In an example embodiment, the cooling system 112 can maintain a temperature or a range of temperature for the capacitor chamber 102. For instance, the cooling system 112 can cool the capacitor chamber 102 to maintain a temperature of 55 degrees C. or cooler. Cooling the capacitors 108 at or below 55 degrees C. can prevent breakdown and failure of one or more capacitors 108 within the capacitor chamber 102. Other embodiments may include cooling the capacitor chamber 102 within other ranges of temperatures.

In addition to maintaining a temperature for the capacitor chamber 102, the cooling system 112 can maintain a temperature or range of temperatures for the transformer chamber 104. For instance, the cooling system 112 can cool the transformer chamber 104 to maintain a temperature of 220 degrees C. or lower. Allowing the transformers to operate at a hotter temperature while preventing overheating can increase the resistance of the iron or other material within the transformers 110 and facilitate more effective performance of the transformers 110 within the system 100. Additionally, the cooling system 112 can cool the transformer chamber 104 at a specific temperature or range of temperature based on a rating of insulation on the transformers 110. For example, the cooling system 112 can cool the transformer chamber 104 at 220 degrees C. based on an insulation on the transformers 110 having a 220 degrees C. rating. Similar to the capacitor chamber 102, other embodiments of the system 100 may cool the transformer chamber 104 within other ranges of temperatures.

In some embodiments, the cooling system 112 may further include one or more features for maintaining an ambient temperature surrounding the system 100. For example, the cooling system 112 may maintain an ambient temperature of 40 degrees C. in the area surrounding the system 100. In regulating the ambient temperature, the cooling system 112 may directly cool an area surrounding the system 100. Additionally or alternatively, the system 100 may maintain an ambient temperature by routing the air flowing through the capacitor chamber 102 and/or the transformer chamber 104 through various outlets of the system 100. For example, the system 100 may include one or more outlets that route air directly to an area surrounding the system 100. Alternatively, the system 100 may include one or more outlets that route air away from an area surrounding the system 100.

Moreover, while the above description specifically describes cooling the different chambers at different operating temperatures according to the operating temperatures of different electrical components, the system 100 can further maintain different chambers at similar or different temperatures based on different units of energy for maintaining an operating temperature of electrical components having different heat loads. For example, the cooling system 112 can cool a first chamber (e.g., capacitor chamber 102) using a first British Thermal Unit (BTU) value and cool a second chamber (e.g., transformer chamber 102) at a second BTU value. Alternatively, the cooling system 112 can include multiple cooling devices that cool different chambers based on different BTU values. In one embodiment, for example, the cooling system 112 can cool a first chamber (e.g., capacitor chamber 102) using 5000 BTUs while cooling the second chamber (transformer chamber 104) using 60,000 BTUs.

Figure 2:
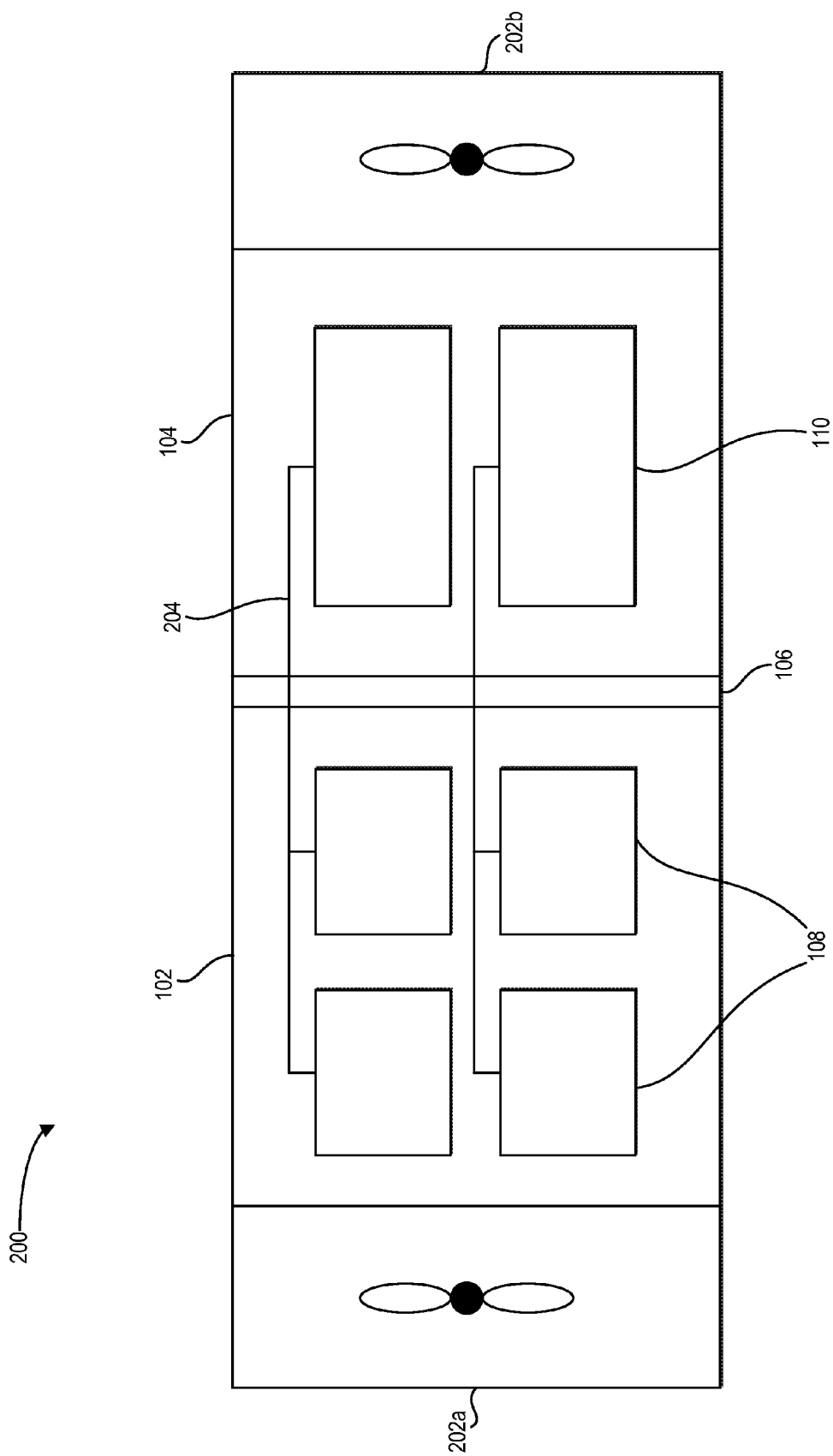
FIG. 2 illustrates a block diagram of an electrical system in accordance with one or more embodiments described herein.

FIG. 2 illustrates an example of an electrical system 200 (or simply "system") in accordance with one or more principles described herein. In particular, the system 200 of FIG. 2 may include similar features and functionality as the system 100 described above in connection with FIG. 1.

For example, as illustrated in FIG. 2, the system 200 can include a capacitor chamber 102, a transformer chamber 104, and a wall 106 providing a seal between the capacitor chamber 102 and the transformer chamber 104. Additionally, as illustrated in FIG. 2, the system 200 can include one or more capacitors 108 contained within the capacitor chamber 102 and one or more transformers 104 contained within the transformer chamber 110. In some embodiments, the system 200 can include a cooling system 112 for cooling the capacitor chamber 102 and/or the transformer chamber 104. For example, as illustrated in FIG. 2, the cooling system 112 can include a first cooling device 202a and a second cooling device 202b.

As mentioned above, the system 200 can include multiple cooling devices 202a-b for cooling the capacitor chamber 102 and the transformer chamber 104. In particular, as illustrated in FIG. 2, the system 200 can include a first cooling device 202a positioned next to or within the capacitor chamber 102. The first cooling device 202a can cool and/or maintain a temperature of the capacitor chamber 102 based on an operating temperature of the capacitors 108. For example, the first cooling device 202a can cool the capacitor chamber 102 based on an expected or desired performance of the capacitors 108 within an electrical circuit.

Additionally, as illustrated in FIG. 2, the system 200 can include a second cooling device 202b positioned next to or within the transformer chamber 104. The second cooling device 202b can cool and/or maintain a temperature of the transformer chamber 104 based on an operating temperature of the transformers 110. For example, the second cooling device 202b can cool the transformer chamber 104 based on an expected or desired performance of the transformers 110 within an electrical circuit.

In some embodiments, the system 200 can include any number of cooling devices 202. For example, as illustrated in FIG. 2, the system 200 can include a first cooling device 202a and a second cooling device 202b. Additionally, in other embodiments, the system 200 can include a separate cooling device 202 for each chamber within the system 200.

Alternatively, the system 200 can include a single cooling device 202 for cooling each of the chambers within the system 200.

In addition to one or more cooling devices 204, the system 200 can include one or more connectors 204 for electrically coupling electrical components that are contained in different chambers. In particular, as illustrated in FIG. 2, the system can include a connector 204 that electrically couples one or more capacitors 108 to one or more transformers 110. The connector 204 can include a wire or other connection for facilitating an electrical connection between one or more components. For example, the connector 204 can include one or more wires passing between the capacitor chamber 102 and the transformer chamber 104. In some embodiments, the connectors 204 can pass through one or more openings in the wall 106. Alternatively, the connectors 204 can pass outside of a first chamber (e.g., the capacitor chamber 202) and into a second chamber (e.g., the transformer chamber 204) through one or more outer walls of the system 200. In some embodiments, one or more capacitors 108 can electrically couple to a corresponding transformer 110. In particular, as illustrated in FIG. 2, one or more capacitors can couple to a single transformer 110. In some embodiments, one capacitor 108 or a group of capacitors 108 can couple in series to a corresponding transformer 110. Further, the transformer 110 and one or more capacitors coupled in series behind the transformer 110 can connect to one or more external systems. The system 200 can include any number of pairings of one or more capacitors 108 and corresponding transformers 110. Alternatively, the system 200 can include a single capacitor 108 or grouping of capacitors 108 and a corresponding transformer 110.

Figure 3:
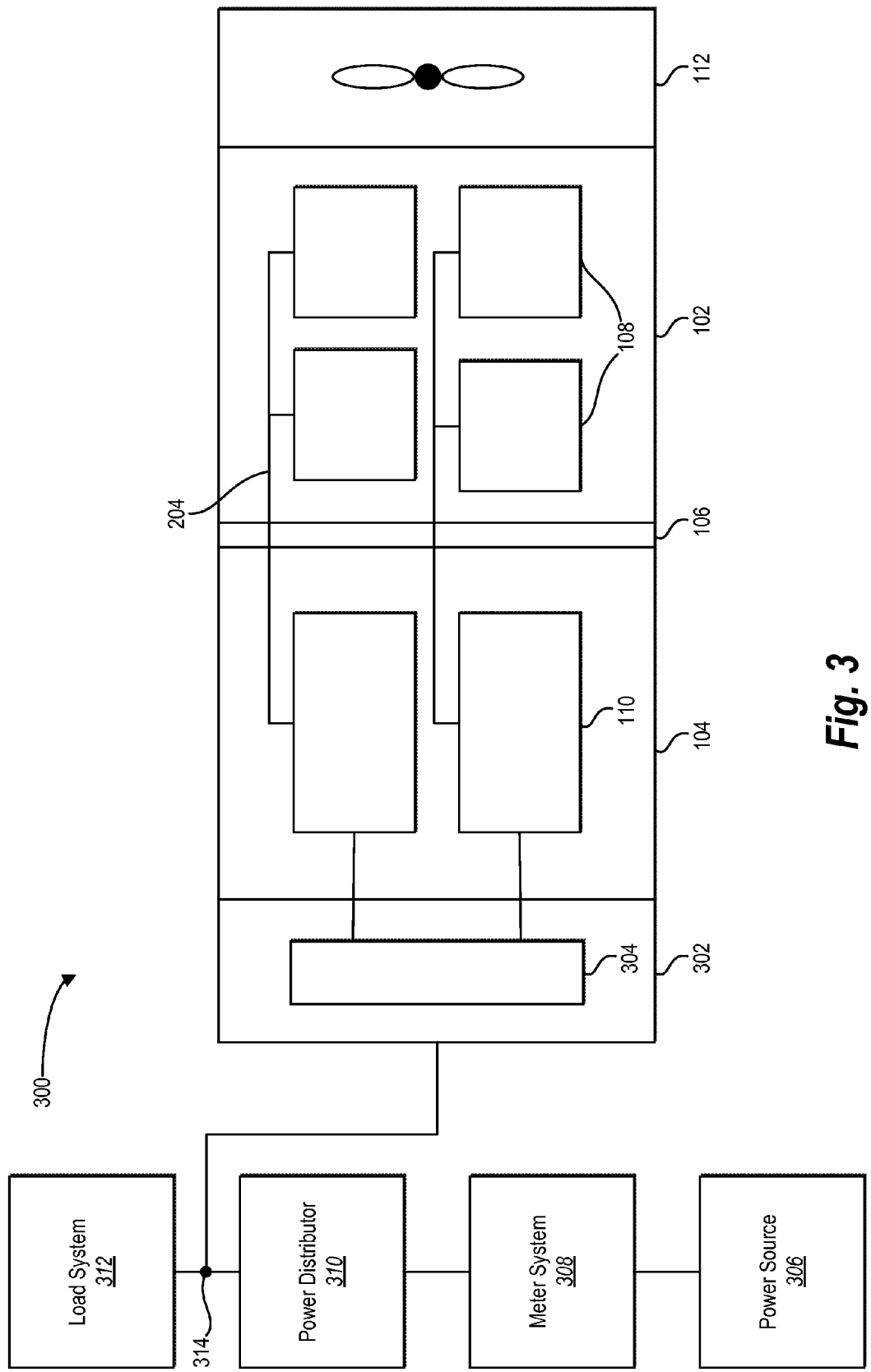
FIG. 3 illustrates a block diagram of an electrical system coupled to a power supply system in accordance with one or more embodiments described herein.

FIG. 3 illustrates an example of an electrical system 300 (or simply "system") coupled to a power supply system in accordance with one or more principles described herein. In particular, the system 300 of FIG. 3 may illustrate an example embodiment applicable to coupling and/or interfacing other systems described herein.

For example, as illustrated in FIG. 3, the system 300 can include similar features as the systems 100, 200 described above in connection with FIGS. 1-2. In particular, the system 300 can include a capacitor chamber 102, a transformer chamber 104, and a wall 106 providing a seal between the capacitor chamber 102 and the transformer chamber 104. Additionally, as illustrated in FIG. 3, the system 300 can include one or more capacitors 108 contained within the capacitor chamber 102 and one or more transformers 110 contained within the transformer chamber 104. The system 300 may further include a cooling system 112 positioned near or within the capacitor chamber 102. Furthermore, as illustrated in FIG. 3, one or more capacitors 108 can couple to corresponding transformers 110 by way of one or more connectors 204.

Additionally, in some embodiments, the system 300 can include a control chamber 302 containing an interface 304 within the control chamber 302. In particular, the system 300 can include a separate control chamber 302 for housing one or more components separate from the capacitors 108 and transformers 110 that provide an interface for coupling the capacitors 108 and/or transformers 110 to an external system. In some embodiments, the interface 304 can connect and/or disconnect the capacitors 108 and transformers 110 to a power supply system. Alternatively, the interface 304 can connect and/or disconnect the capacitors 108 and transformers 110 from a different external system.

The interface 304 can include one or more components for connecting and/or disconnecting the capacitors 108 and transformers 110 from an external system. In particular, the interface 304 can include breakers, switches, and other circuit components capable of connecting and/or disconnecting the capacitors 108 and transformers 110 from the external system. For example, the interface 304 can include a main breaker for connecting and/or disconnecting all of the capacitors 108 and transformers 110 within the system 300 from the external system. Additionally, the interface 304 can include one or more additional breakers or switches for connecting and/or disconnecting individual capacitors 108, transformers 110, or groupings of capacitors 108 and corresponding transformers from the external system.

As mentioned above, the system 300 can connect to a power supply system. As illustrated in FIG. 3, the power supply system can include a power source 306, a meter system 308 (e.g., a power meter), a power distributor 310, and a load system 312. In particular, the system 300 can connect to the power supply system via the interface 304 at a point of common coupling. As used herein, the point of common coupling can refer to any point in the power supply system between the power source 306 and one or more loads on a load system 312 powered by the power source 306. For example, a point of common coupling may refer to a connection at one or more points within the power distributor 310. More specifically, a point of common coupling can refer to a node in the power supply system at an output of the power distributor 310 (e.g., a switch board).

The power supply system can include a power source 306 that provides electrical power to one or more loads on a load system 312. In particular, in some embodiments, the power source 306 can provide electrical power to the load system 312 via the meter system 308 that measures a consumption of electrical power. Further, the power distributor 310 can receive the electrical power and distribute the electrical power to one or more loads of the load system 312.

In some embodiments, the system 300 can connect and/or disconnect from an external system without interrupting normal operation of the external system. For example, as illustrated in FIG. 3, the system 300 can connect and/or disconnect to a point of common coupling 314 using a parallel configuration. In some embodiments, the system 300 can connect and/or disconnect from the power supply system without interrupting operation of the power supply system and/or interrupting the supply of electrical power to the load system 312.

Figure 4A:
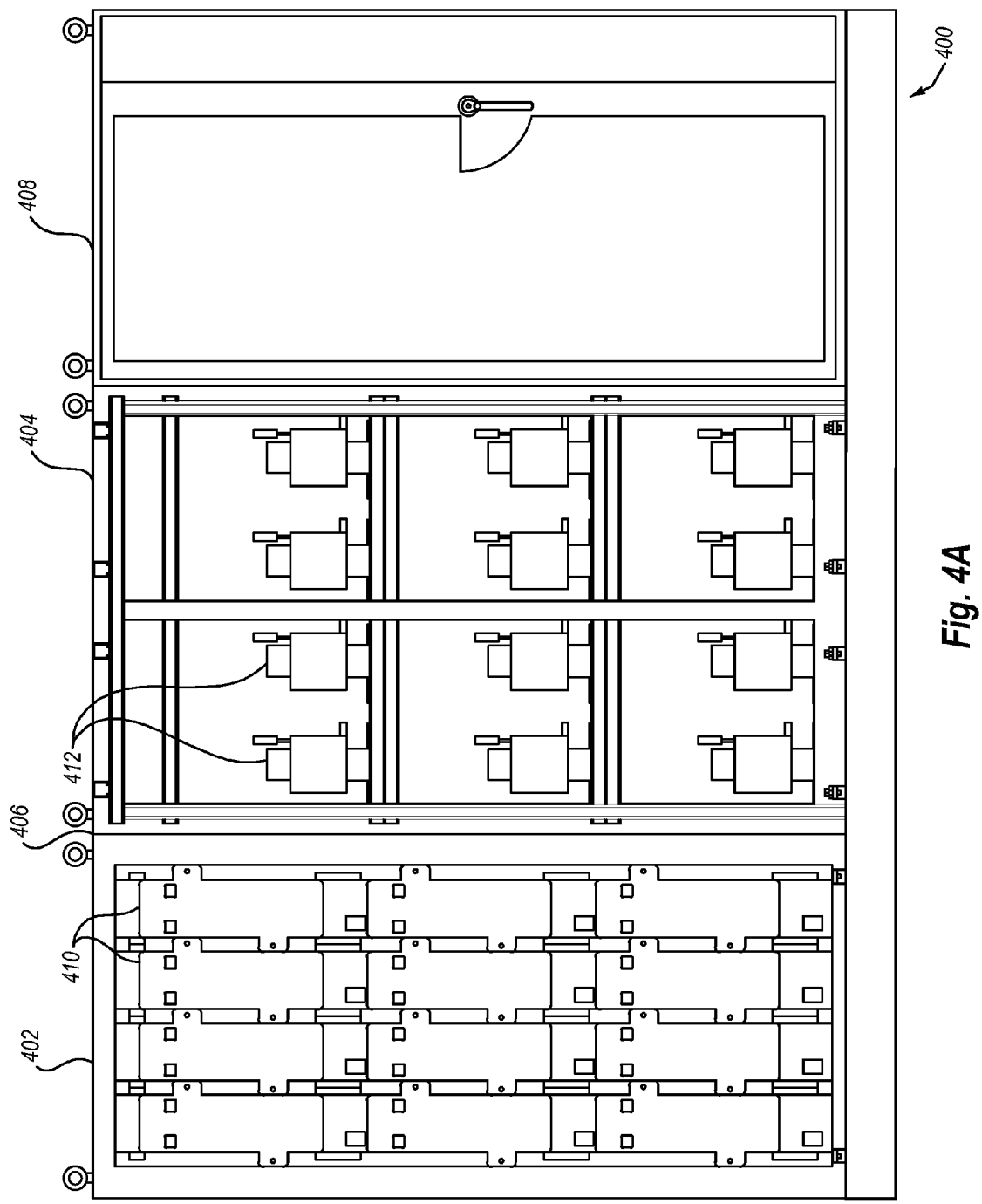
FIG. 4A illustrates a block diagram of an electrical system in accordance with one or more embodiments described herein.

FIG. 4A illustrates an example of an electrical system 400 (or simply "system") in accordance with one or more embodiments described herein. In particular, the system 400 of FIG. 4A may illustrate a more detailed embodiment of the systems 100, 200, 300 described above in connection with FIGS. 1-3. Additionally, the system 400 can include similar features and functionality as similar components described above in connection with other FIGS.

As illustrated in FIG. 4A, the system 400 can include a capacitor chamber 402, a transformer chamber 404, and a wall 406 providing a seal between the capacitor chamber 402 and the transformer chamber 404. Additionally, as illustrated in FIG. 4A, the system 400 can include one or more capacitors 410 contained within the capacitor chamber 402 and one or more transformers 412 contained within the transformer chamber 404. The system 400 can further include a control chamber 408. While not illustrated in FIG. 4A, the system 400 can further include a cooling system for cooling and/or maintaining the capacitor chamber 402 and the transformer chamber 404 at different temperatures based a desired operating temperature of the capacitors 410 and transformers 412.

As illustrated in FIG. 4A, the capacitor chamber 402 can include one or more capacitor casings (or simply "casings") for securing one or more capacitors 410 within the capacitor chamber 402. In particular, the capacitor chamber 402 can include removable casings for accessing and or servicing the capacitors 410. Additionally the casings can include one or more features for providing adequate air flow through the capacitor chamber 402 and facilitating easy access to the capacitors 410 contained within the capacitor chamber 402. The casings will be described in additional detail below in connection with FIGS. 6A and 6B.

Figure 4B:
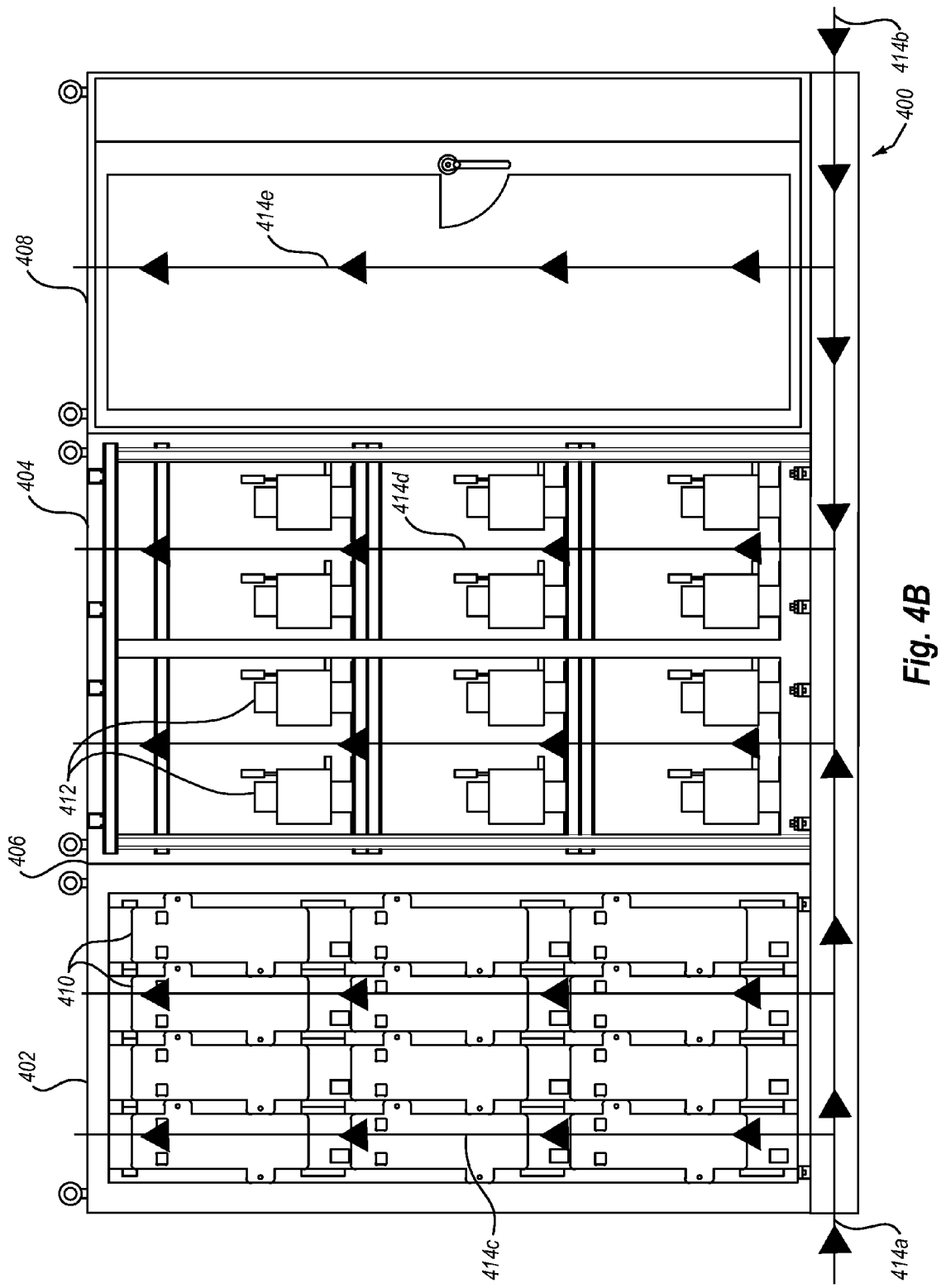
FIG. 4B illustrates another block diagram of an electrical system in accordance with one or more embodiments described herein.

FIG. 4B illustrates the example electrical system 400 (or simply "system") described above in connection with FIG. 4A. Additionally, FIG. 4B illustrates one embodiment of the system 400 in which air flows through one or more chambers within the system 400 along one or more airflow path portions 414a-e. For example, as illustrated in FIG. 4B, a first airflow path portion 414a may pass into the system 400 through an opening below the capacitor chamber 402. Further, as illustrated in FIG. 4B, a second airflow path portion 414b may pass into the system 400 through an opening below the control chamber 408. Alternatively, one or more airflow path portions may pass into the system 400 through one or more additional openings (e.g., below the transformer chamber 404).

As shown in FIG. 4A, each of the first airflow path portion 414a and the second airflow path portion 414b passes through an opening (e.g., an air gap) that passes underneath the capacitor chamber 402, transformer chamber 404, and the control chamber 408. In some embodiments, air passing along the first and second airflow path portions 414a-b can enter the system 400 via one or more cooling devices (e.g., cooling fans). For example, air passing along the first airflow path portion 414a may enter the system 400 via a first cooling device while air passing along the second airflow path portion 414b may enter the system 400 via a second cooling device. Alternatively, air passing along the first and second airflow path portions 414a-b may derive from the same cooling device.

As shown in FIG. 4B, air passing along the first airflow path 414a and air passing along the second airflow path 414b may enter each of the different chambers of the system 400 and cool various electrical components throughout the system 400. For example, as shown in FIG. 4B, air may pass from the first airflow path portion 414a to a third airflow path portion 414c (e.g., through one or more openings in the bottom of the capacitor chamber 402) and cool capacitors 410 within the capacitor chamber 402. Additionally, air may pass from the first airflow path portion 414a to a fourth airflow path portion 414d (e.g., through one or more openings in the bottom of the transformer chamber 404) and cool transformers 412 within the transformer chamber 404. Further, as shown in FIG. 4B, air may pass from the second airflow path portion 414b to a fifth airflow path portion 414e (e.g., through one or more openings in the bottom of the control chamber 408) and cool one or more electrical components within the control chamber 408. Additionally, as shown in FIG. 4B, air may pass from the second airflow path portion 414b to the fourth airflow path portion 414d (e.g., through one or more openings in the bottom of the transformer chamber 404) and cool the transformers 414 within the transformer chamber 404.

Moreover, while not explicitly shown in FIG. 4B, in some embodiments of the system 400, air passing along the first airflow path portion 414 may pass from the first airflow path portion 414a to the fifth airflow path portion 414e through the control chamber 408. Additionally, in some embodiments of the system 400, air passing along the second airflow path portion 414b may pass from the second airflow path portion 414b to the third airflow path portion 414c through the capacitor chamber 402. Alternatively, the airflow path 414 may include one or more controls for directing air throughout the system 400 and cooling different chambers using different sources of air. As an example, some embodiments of the system 400 may direct air entering the system 400 along the first airflow path portion 414a to pass exclusively through the capacitor chamber 402 along the third airflow path portion 414c without allowing any air from the first airflow path portion 414a to pass through the transformer chamber 404. In the same example, the system 400 may direct air entering the system 500 along the second airflow path portion 414b to pass exclusively through the transformer chamber 404 along the fourth airflow path portion 414d without allowing any air from the second airflow path portion 414b to pass through the capacitor chamber 402.

Additionally, the system 400 may include one or more outlets or ventilation systems that facilitate air exiting the system 400 (e.g., through one or more openings in the chambers). For example, air passing along the third airflow path portion 414c may exit the capacitor chamber 402 via one or more openings in the top of the capacitor chamber 402. Additionally, air passing along the fourth airflow path portion 414d may exit the transformer chamber 404 via one or more openings in the top of the transformer chamber 404. Further, air passing along the fifth airflow path portion 414e may exit the control chamber 408 via one or more openings in the top of the control chamber 408. Moreover, while not explicitly shown in FIG. 4B, some embodiments of the system 400 may include one or more openings in the wall 406 positioned between the capacitor chamber 402 and the transformer chamber 404 that facilitates air passing between the chambers. For example, in an embodiment where a cooling system maintains the capacitors 410 at approximately 55 degrees C. and maintains the transformers 412 at approximately 220 degrees C., the system 400 can include one or more features to direct air from the capacitor chamber 402 into the transformer chamber 404 (e.g., through an opening in the wall 406) and exit the system through an opening in the top of the transformer chamber 404.

FIG. 5 illustrates an example electrical system (or simply "system") in accordance with one or more principles described herein. In particular, FIG. 5 illustrates an example embodiment of a system 500 for cooling different types of electrical components. Additionally, the system 500 can include components having similar features and functionality as components described above in connection with other FIGS.

As illustrated in FIG. 5, the system 500 can include a capacitor chamber 502 and a transformer chamber 504. The system 500 can further include one or more capacitors 506 contained within the capacitor chamber 502 and one or more transformers 508 contained within the transformer chamber 504. As illustrated in FIG. 5, the capacitors 506 and transformers 508 can rest on shelves within the respective chambers 502, 504. In some embodiments, the shelves can include one or more features to facilitate air flow through the chambers 502, 504.

In some embodiments, the system 500 can include an intermediate chamber 510 positioned between the capacitor chamber 502 and the transformer chamber 504. The intermediate chamber 510 can contain one or more cooling systems, such as a capacitor cooling system 512 and a transformer cooling system 514. In some embodiments, the intermediate chamber 510 can contain the capacitor cooling system 512 and the transformer cooling system 514. Alternatively, the capacitor chamber 502 can contain the capacitor cooling system 512 and/or the transformer chamber 504 can contain the transformer cooling system 514.

As illustrated in FIG. 5, the intermediate chamber 510 can include one or more openings in the walls and/or ceiling of the intermediate chamber 510. In particular, the intermediate chamber 510 can include a first opening 516 in a wall between the intermediate chamber 510 and the capacitor chamber 502 to facilitate airflow between the capacitor chamber 502 and the intermediate chamber 510. Additionally, the intermediate chamber 510 can include a second opening 518 in a wall between the intermediate chamber 510 and the transformer chamber 504 to facilitate airflow between the transformer chamber 504 and the intermediate chamber 510.

In addition to the first opening 516 and the second opening 518, the intermediate chamber 510 can further include an outlet opening 520. In particular, the intermediate chamber 510 can include an outlet opening 520 in the ceiling or wall of the intermediate chamber 510 through which air can exit the system 500. For example, air can pass into the intermediate chamber 510 through the first opening 516 and/or the second opening 518 and exit the intermediate chamber through the outlet opening 520. In some embodiments, the intermediate chamber 510 can include a single outlet opening 520. Alternatively, the intermediate chamber 510 can include multiple outlet openings 520.

As mentioned above, the capacitor cooling system 512 can provide cooling air for cooling the capacitors 506 contained within the capacitor chamber 502. In particular the capacitor cooling system 512 can create an airflow path 522 that passes through the capacitor chamber 502 and cools each of the capacitors 506 contained within the capacitor chamber 502. In some embodiments, the airflow path 522 enters the capacitor chamber 502 from the capacitor cooling system 512 and passes through the capacitor chamber 502 cooling the capacitors 504. As illustrated in FIG. 5, the airflow path 522 can exit the capacitor chamber 502 through an opening 516 into the intermediate chamber 510 and exit the intermediate chamber 510 through an outlet opening 520. While FIG. 5 illustrates the airflow path 522 exiting the system 500 through the outlet opening 520, the airflow path 522 can alternatively exit the system 500 through another outlet (e.g., through an opening in the capacitor chamber 502).

The transformer cooling system 514 can provide cooling air for cooling the transformers 508 contained within the transformer chamber 504. In particular, the transformer cooling system 514 can create an airflow path 524 that passes through the transformer chamber 504 and cools each of the transformers 508 contained within the transformer chamber 504. In some embodiments, the airflow path 524 enters the transformer chamber 504 from the transformer cooling system 514 and passes through the transformer chamber 504 cooling the transformers 508. As illustrated in FIG. 5, the airflow path 524 can exit the transformer chamber 504 through an opening 518 into the intermediate chamber 510 and exit the intermediate chamber through an outlet opening 520. While FIG. 5 illustrates the airflow path 524 exiting the system 500 through the outlet opening 520, the airflow path 524 can alternatively exit the system 500 through another outlet (e.g., through an opening in the transformer chamber 504).

Figure 6A:
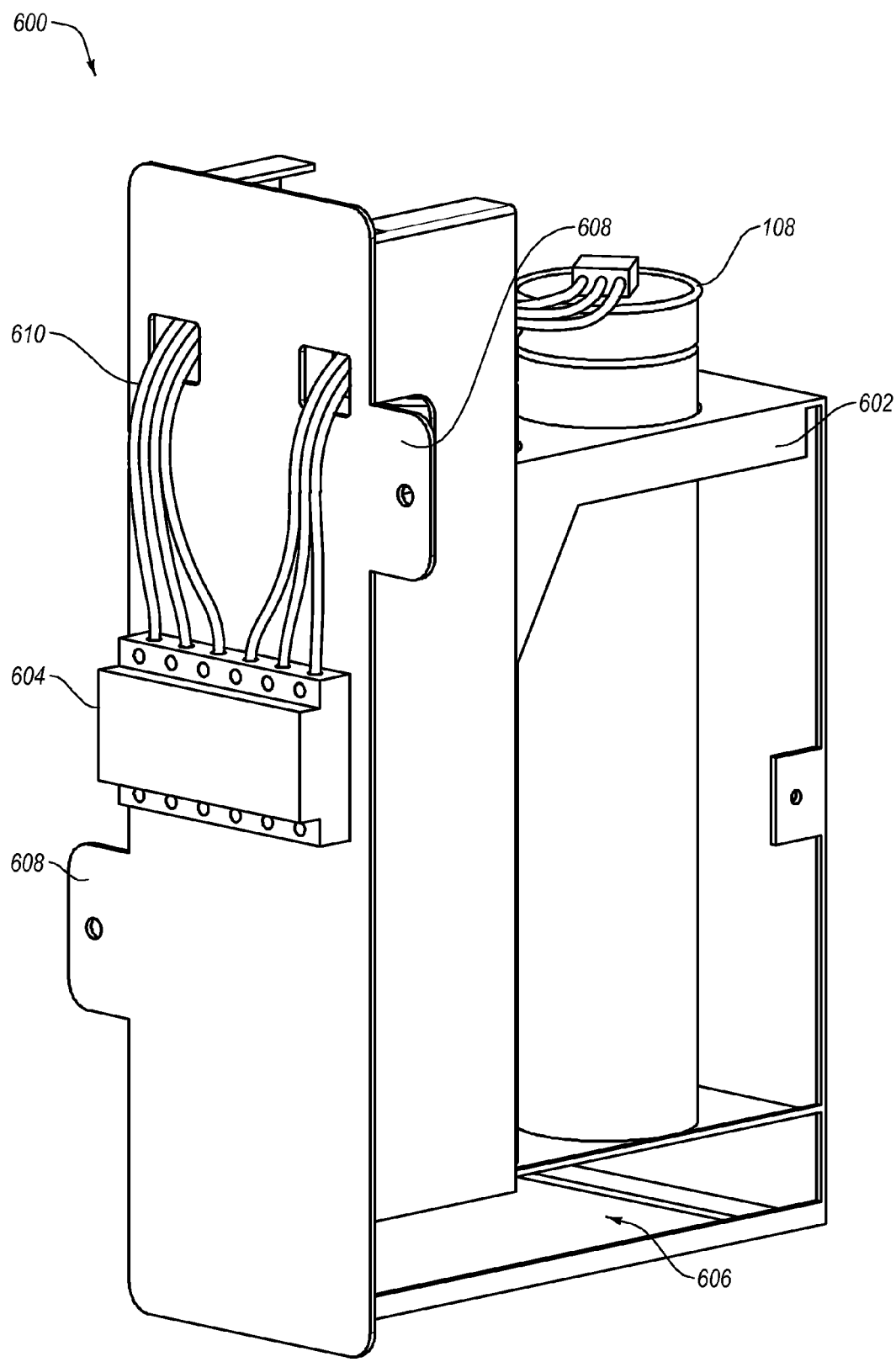
FIG. 6A illustrates a perspective view of a removable casing in accordance with one or more embodiments described herein.

FIG. 6A illustrates an example of a removable casing 600 (or simply "casing") in accordance with one or more principles described herein. In particular, FIG. 6A illustrates a perspective view of a casing 600 that can secure one or more electrical components within a capacitor chamber 102 and/or transformer chamber 104 described herein. More specifically, FIG. 6A illustrates a casing 600 for securing one or more capacitors 108 within a capacitor chamber 102. Nevertheless, it is appreciated that the casing 600 can secure one or more different types of electrical components within a chamber.

In particular, the casing 600 can be implemented within the capacitor chamber 102 described above in connection with the other FIGS. For example, the casing 600 can encase and/or secure one or more capacitors 108 within the capacitor chamber 102. For example, the capacitors 108 within the casing 600 can include a group of capacitors 108 that are coupled to a corresponding transformer 110 in a transformer chamber 104. In some embodiments, each of the capacitors 108 within the casing 600 can have a similar capacitance. Alternatively, one or more of the capacitors 108 within the casing 600 can have a different capacitance.

In some embodiments, the capacitors 108 within the casing 600 can represent a grouping of capacitors 108 coupled to a transformer 110. In particular, each of the capacitors 108 within the casing 600 can couple in parallel to each of the other capacitors 108 within the casing 600 to cumulatively form a desired capacitance or volt ampere reactance (kvar) value for an electrical circuit. Thus, a casing 600 can represent a combination of different capacitors 108 that have a cumulative capacitance and/or kvar value. For example, all of the capacitors 108 in parallel can have a cumulative capacitance based on a corresponding transformer 110 and or an external system to which the capacitors 108 are coupled. In some embodiments, the capacitors 108 can selectively couple and/or decouple from an external system. Alternatively, all of the capacitors 108 may couple and/or decouple from an external system collectively.

The capacitors 108 can have a range of capacitance values based on one or more electrical components coupled to the capacitors 108. In particular, the capacitors 108 may have a capacitance based on one or more transformers 110 coupled to one or more of the capacitors 108. For example, in some embodiments, one or more capacitors 108 in parallel may have a collective capacitance of 125 microfarads. Alternatively, the capacitors 108 may have other capacitance values.

Additionally, the capacitors 108 can have a range of volt ampere reactance (kvar) values based on one or more electrical components coupled to the capacitors 108. For example, the cumulative kvar of the capacitors 108 can equal 40 kvar. In some embodiments, a first of the capacitors 108 can have a 30 kvar value while a second capacitor 108 has a 10 kvar value. Selecting a 30 kvar capacitor and a 10 kvar capacitor can provide a more economical combination of capacitors 108 than designing and/or purchasing a less common 40 kvar capacitor, for example.

As illustrated in FIG. 6A, the casing 600 can include a body 602 defining a structure for the casing 600. In particular, the body 602 can form a back surface, a front surface and one or more side surfaces extending a length of the casing 600. In some embodiments, the back, front, and side surfaces can include a railing or other support that provides a structure for the casing 600 while permitting air to pass through the inside of the casing 600. Alternatively, in some embodiments, the body 602 can include a back, front, and/or side surface that covers an entire surface of the casing 600 without permitting air flow through one or more surfaces of the body 602.

In some embodiments, the body 602 can include an opening through the top and/or bottom of the casing 600. For example, as illustrated in FIG. 6A, the top of the body 602 can include an opening through which one or more capacitors 604 are accessible. Providing access to the capacitors 604 can facilitate convenient servicing and/or troubleshooting of the system 100. Additionally, providing access to the capacitors 604 can facilitate convenient updating and/or modifying of the capacitors 604 secured within the casing 600.

In some embodiments, the casing 600 can include a breaker circuit 604 coupled to the capacitors 108. In particular, as illustrated in FIG. 6A, the casing 600 can include a breaker circuit 604 positioned on a front portion of the casing 600 electrically coupled to each of the capacitors 108. In some embodiments, the breaker circuit 604 can include separate breakers and/or switches for each of the capacitors 108 within the casing 600. Alternatively, the breaker circuit 604 can include a single breaker and/or switch for all of the capacitors 108 within the casing 600.

The breaker circuit 604 can connect and/or disconnect one or more capacitors 108 from other electrical components within the system 100. In particular, the breaker circuit 604 can connect and/or disconnect the capacitors 108 from a corresponding transformer 110. Additionally the breaker circuit 604 can connect and/or disconnect the capacitors 108 from an external system. In some embodiments, the breaker circuit 604 can maintain an electrical connection between the capacitors 108 and a corresponding transformer 110 while the casing 600 is removed from the capacitor chamber 102. Alternatively, the breaker circuit 604 can disconnect the capacitors from a corresponding transformer 110 while the casing 600 is removed from the capacitor chamber 102.

The casing 600 can further include an air gap 606 on a bottom portion of the casing 600. In particular, the casing 600 can include an air gap 606 under which air can flow when passing through the capacitor chamber 102 and cooling the capacitors 108. In some embodiments, cooling air can flow underneath the casing 600 to cool the capacitors 108 from underneath the casing 600. Additionally or alternatively, the cooling air can flow into the air gap and upward through the casing 600 to cool the capacitors 108.

As mentioned above, the casing 600 can include one or more features to facilitate convenient access to the capacitors 108 within the casing 600. For example, the casing 600 can slide in and out of the capacitor chamber 102 to gain access to the capacitors 108. In some embodiments, sliding the casing 600 out of the capacitor chamber 102 can grant access to the capacitors 108 through an opening in the top of the casing 600. Additionally or alternatively, the casing 600 can provide access to the capacitors 108 through a side of the casing 600.

In addition to removing the casing 600 from the capacitor chamber 102, the casing 600 can include one or more features for securing the casing 600 within the capacitor chamber 102. For example, the casing 600 can include one or more fastening points 608 at which the casing 600 can fasten to the structure of the capacitor chamber 102. In particular, fastening point 608 can include one or more openings through which a nail, screw, bolt, or other fastening tool can secure the casing 600 in place within the capacitor chamber 102. Alternatively, in some embodiments, the casing 600 can rest in place within the capacitor chamber 102 without securing to the structure of the capacitor chamber 102.

The casing 600 can facilitate efficient replacement and/or modification of components within the casing 600. For example, a technician can easily remove and/or replace each of the capacitors 108. In some embodiments, a technician can remove and/or replace each of the capacitors 108 individually. Alternatively, a technician can remove and/or replace the entire casing 600 with a grouping of new capacitors 108.

Similar to FIG. 6A, FIG. 6B illustrates an example of a removable casing 600 (or simply "casing") in accordance with one or more principles described herein. In particular, FIG. 6B illustrates a top view of the casing 600 described above in connection with FIG. 6A. As illustrated in FIG. 6B, the casing 600 can include a body 602, capacitors 108 contained within the body 602, a breaker circuit 604 positioned on a front surface of the body 602, an air gap 606 (not shown) positioned under the body 602, and one or fastening points 608.

Additionally, as illustrated in FIG. 6B, each of the capacitors 108 can connect to the breaker circuit 604 by way of one or more wires 610. In particular, each capacitor 108 can couple to the breaker circuit 604 using wires 610 routed between the breaker circuit 604 and one or more terminals on the capacitors 108. For example, in some embodiments, each capacitor 108 can couple to the breaker circuit 604 by way of three wires connected to three terminals on each of the capacitors 108.

Furthermore, the capacitors 108 can connect to the breaker circuit 604 using a variety of circuit configurations. For example, as illustrated in FIG. 6B, each of the capacitors 108 can connect to the breaker circuit 604 in a parallel configuration. Alternatively, each of the capacitors 108 can connect to the breaker circuit 604 in a series configuration. Additionally, one or more capacitors 108 may connect to the breaker circuit 604 independently from other capacitors 108 within the casing 600.

Figure 7:
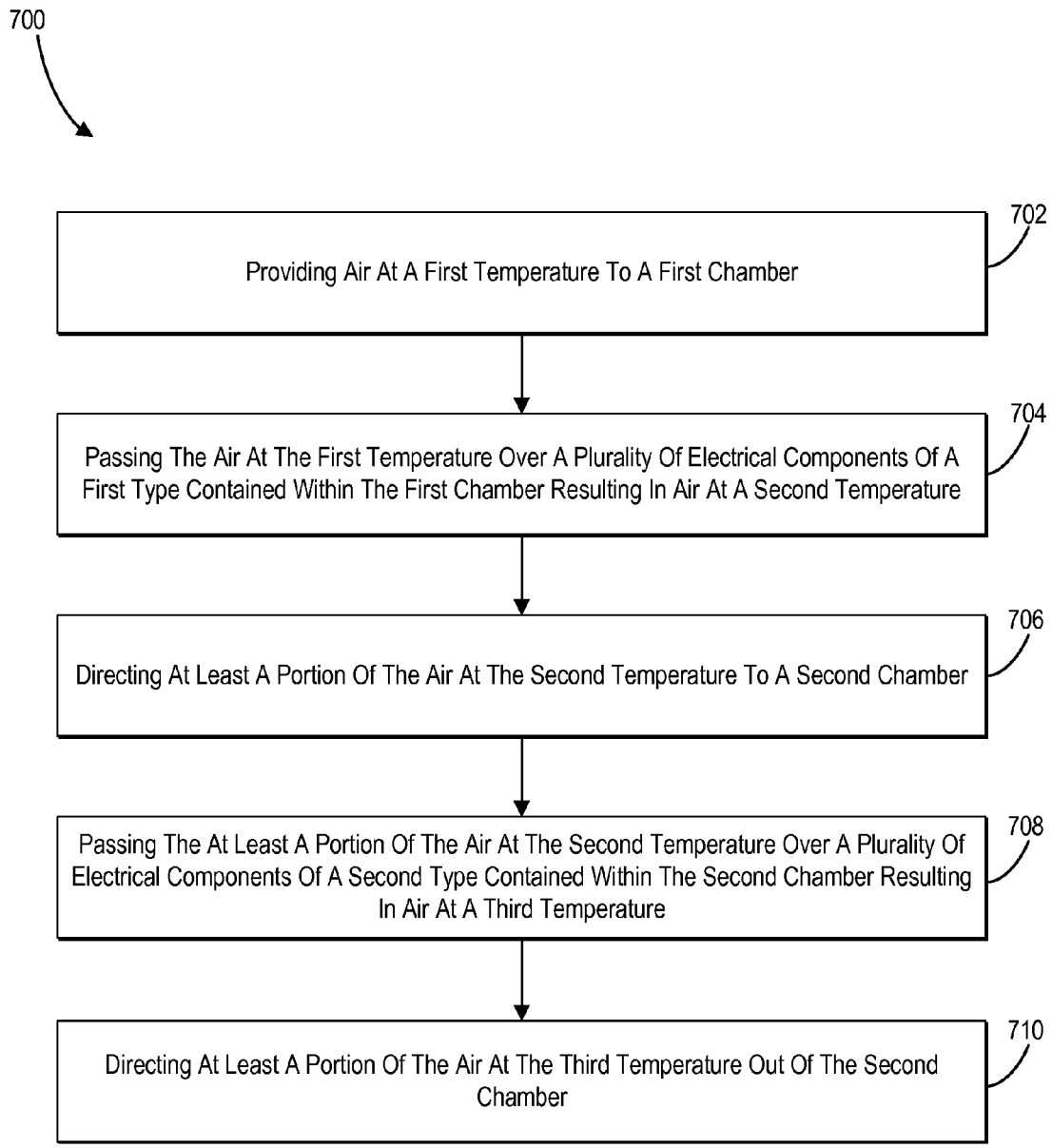
FIG. 7 illustrates a flow diagram illustrating a method for cooling an electrical system in accordance with one or more embodiments described herein.

FIG. 7 illustrates a flow diagram of one exemplary method 700 of cooling an electrical system 100 (or simply "system"). While FIG. 7 illustrates exemplary steps according to one embodiment, other embodiments may omit, add to, reorder, and/or modify any of the steps shown in FIG. 7. One or more steps shown in FIG. 7 may be performed using one or more components illustrated in the system 100. Further, one or more steps can be performed using one or more components illustrated in the systems 200, 300, 400, 500 and casing 600 described above in connection to the other FIGS.

Method 700 can include the act 702 of providing air at a first temperature to a first chamber. In particular, a cooling system 112 can provide air to a capacitor chamber 102 at a first temperature. For example, the cooling system 112 can include a fan that directs air into the capacitor chamber 102. Alternatively, the cooling system 112 can include one or more other devices for directing air into the capacitor chamber 102.

The method 700 can further include the act 704 of passing the air at the first temperature over a plurality of electrical components of a first type contained within the first chamber resulting in air at a second temperature. For example, the air can pass through the capacitor chamber 102 and over the capacitors 108 contained within the capacitor chamber 102. Passing the air over the capacitors 108 can result in the air heating up to a second temperature.

The method 700 can further include the act 706 of directing at least a portion of the air at the second temperature to a second chamber. For example, the system 100 can direct air from the capacitor chamber 102 into the transformer chamber 104. In some embodiments, the cooling system 112 can maintain the capacitor chamber 102 at a lower temperature than the transformer chamber 104. Providing air from the capacitor chamber 102 into the transformer chamber 104 can cool one or more transformers 110 contained within the transformer chamber 104. In some embodiments, only a portion of the air is directed from the capacitor chamber 102 to the transformer chamber 104. Some or all of the remaining air may be redirected to the capacitor chamber 102 for providing additional cooling to the capacitors 108. Alternatively, the remaining air may be directed out of the system 100 through an opening in the system 100 and/or by way of a ventilation system.

The method 700 can further include the act 708 of passing at least a portion of the air at the second temperature over a plurality of electrical components of a second type contained within the second chamber resulting in air at a third temperature. For example, the air can pass through the transformer chamber 104 and over the transformers 110 contained within the transformer chamber 104. Passing the air over the transformers 110 can result in the air heating up to a third temperature.

The method 700 can further include the act 710 of directing at least a portion of the air at the third temperature out of the second chamber. For example, the system 100 can direct air from the transformer chamber 104 out of one or more openings in the transformer chamber 104. In some embodiments, the system 100 can include one or more fans or other mechanism for directing the air out of the transformer chamber.

The embodiments can be embodied in other specific forms without departing from its spirit or essential characteristics. The described embodiments are to be considered in all respects only as illustrative and not restrictive. For example, the methods described herein can be performed with less or more steps/acts or the steps/acts can be performed in differing orders. Additionally, the steps/acts described herein may be repeated or performed in parallel with one another or in parallel with different instances of the same or similar steps/acts. The scope of the embodiments is, therefore, indicated by the appended claims rather than by the foregoing description. All changes that come within the meaning and range of equivalency of the claims are to be embraced within their scope.

What is claimed is:

1. A system, comprising:
    a first chamber containing a plurality of electrical components of a first type having a first operating temperature;
    a second chamber containing a plurality of electrical components of a second type, the electrical components of the second type having a second operating temperature different than the first operating temperature, wherein each of the plurality of electrical components of the first type are electrically coupled to a corresponding electrical component of the second type from the plurality of electrical components of the second type; and
    a cooling system that maintains the first chamber at a first temperature based on the first operating temperature and maintains the second chamber at a second temperature based on the second operating temperature.

2. The system of claim 1, wherein the plurality of electrical components of the first type comprises a plurality of capacitors.

3. The system of claim 2, wherein the plurality of electrical components of the second type comprises a plurality of transformers.

4. The system of claim 3, wherein the plurality of transformers comprises a plurality of zig-zag transformers.

5. The system of claim 1, wherein the cooling system comprises a first fan for cooling the first chamber and a second fan for cooling the second chamber.

6. The system of claim 1, wherein the plurality of electrical components of the first type and the plurality of electrical components of the second type form a power correction circuit configured to be coupled to a power delivery system.

7. The system of claim 1, wherein the plurality of electrical components of the second type are coupled in series behind the plurality of electrical components of the first type from a point of common coupling.

8. The system of claim 1, further comprising a plurality of switches coupled between the plurality of electrical components of the first type and the plurality of electrical components of the second type, wherein the plurality of switches are configured to electrically couple or decouple the plurality of electrical components of the first type from the plurality of electrical components of the second type.

9. The system of claim 1, wherein the plurality of electrical components of the first type comprises one or more groups of electrical components of the first type that are further housed within a removable casing.

10. The system of claim 9, wherein each of the one or more groups of electrical components comprises multiple electrical components of the first type, wherein each of the electrical components within each group are electrically coupled in series to a corresponding electrical component of the second type.

11. The system of claim 1, wherein the cooling mechanism is positioned adjacent to the first chamber.

12. The system of claim 11, wherein the first chamber is positioned between the cooling mechanism and the second chamber.

13. The system of claim 1, further comprising a control chamber that contains one or more electrical components for interfacing between a power delivery system and each of the electrical components of the first type and the electrical components of the second type.

14. A method comprising:
    providing air at a first temperature to a first chamber containing a plurality of electrical components of a first type having a first operating temperature;
    passing the air at the first temperature over the plurality of electrical components of the first type contained within the first chamber resulting in air at a second temperature;
    directing at least a portion of the air at the second temperature to a second chamber containing a plurality of electrical components of a second type having a second operating temperature, wherein each of the plurality of electrical components of the first type are electrically coupled to a corresponding electrical component of the second type from the plurality of electrical components of the second type;
    passing the at least a portion of the air at the second temperature over the plurality of electrical components of the second type contained within the second chamber resulting in air at a third temperature; and
    directing at least a portion of the air at the third temperature out of the second chamber and to a cooling system that cools the air at the third temperature resulting in the air at the first temperature, and where the cooling system maintains the first chamber at the first operating temperature of the plurality of electrical components of the first type and maintains the second chamber at the second operating temperature of the plurality of electrical components of the second type.

15. The method of claim 14, further comprising maintaining the second temperature at or below 70 degrees Celsius.

16. The method of claim 14, further comprising maintaining the third temperature at or above 200 degrees Celsius.

17. A system, comprising:
   a first chamber containing a plurality of electrical components of a first type, the first chamber being cooled at a first temperature by a cooling system based on a first operating temperature associated with the plurality of electrical components of the first type;
   a second chamber containing a plurality of electrical components of a second type, the second chamber being cooled at a second temperature by a cooling system based on a second operating temperature associated with the electrical components of the second type; and
   one or more removable casings configured to secure the plurality of electrical components of the first type within the first chamber, wherein each of the one or more removable casings contain at least one electrical component of the first type electrically coupled to a corresponding electrical component of the second type.

18. The system of claim 17, wherein the removable casing comprises a gap for passing air beneath the plurality of electrical components of the first type.

19. The system of claim 17, wherein each of the one or more removable casings is configured to secure a group of electrical components of the first type, wherein each of the group of electrical components of the first type are coupled to a corresponding electrical components of the second type.

* * * * *